US006927530B2

(12) United States Patent
Tanaya et al.

(10) Patent No.: US 6,927,530 B2
(45) Date of Patent: Aug. 9, 2005

(54) VIBRATING PIECE, VIBRATOR, OSCILLATOR, AND ELECTRONIC DEVICE

(75) Inventors: Hideo Tanaya, Suwa (JP); Fumitaka Kitamura, Suwa (JP); Junichiro Sakata, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/771,666

(22) Filed: Feb. 4, 2004

(65) Prior Publication Data

US 2004/0155561 A1 Aug. 12, 2004

Related U.S. Application Data

(62) Division of application No. 10/047,420, filed on Jan. 14, 2002.

(30) Foreign Application Priority Data

Jan. 15, 2001 (JP) ....................................... 2001-006638

(51) Int. Cl.[7] ..................... H01L 41/053; H01L 41/047; H03H 9/17
(52) U.S. Cl. ...................... 310/348; 310/351; 310/365; 310/370
(58) Field of Search .............................. 310/340, 348, 310/351, 365, 370

(56) References Cited

U.S. PATENT DOCUMENTS

| | | | |
|---|---|---|---|
| 3,423,700 A | 1/1969 | Curran et al. ............... 333/187 |
| 3,683,213 A | 8/1972 | Staudte ....................... 310/312 |
| 4,223,177 A | 9/1980 | Nakamura ................. 174/52.3 |
| 4,384,232 A * | 5/1983 | Debely ....................... 310/370 |
| 4,410,827 A * | 10/1983 | Kogure ....................... 310/370 |
| 5,861,705 A * | 1/1999 | Wakatsuki et al. .......... 310/370 |
| 5,912,592 A | 6/1999 | Kikushima .................... 331/68 |
| 6,005,329 A | 12/1999 | Ikeda et al. .................. 310/340 |
| 6,194,817 B1 * | 2/2001 | Yachi et al. ................. 310/370 |
| 6,587,009 B2 * | 7/2003 | Kitamura et al. ........... 331/158 |
| 6,700,313 B2 * | 3/2004 | Dalla Piazza et al. ...... 310/370 |
| 6,724,271 B2 * | 4/2004 | Sakata et al. ............... 331/156 |
| 6,791,243 B2 * | 9/2004 | Kawashima ................ 310/370 |
| 2002/0121941 A1 | 9/2002 | Sakata et al. ............... 331/154 |
| 2002/0125794 A1 * | 9/2002 | Tanaya et al. ......... 310/323.06 |
| 2002/0166379 A1 | 11/2002 | Paros et al. ............... 73/504.12 |

FOREIGN PATENT DOCUMENTS

| | | | | |
|---|---|---|---|---|
| JP | 52052597 | | 4/1977 | ............ H03H/9/14 |
| JP | 55138916 | | 10/1980 | ............ H03H/9/25 |
| JP | 56065517 | | 5/1983 | ............ H03H/9/13 |
| JP | 2001-235331 | * | 8/2001 | ............ G01C/19/56 |

* cited by examiner

*Primary Examiner*—Thomas M. Dougherty
(74) *Attorney, Agent, or Firm*—Harness, Dickey & Pierce, P.L.C.

(57) ABSTRACT

A vibrating piece in which a CI values ratio is maintained constant while minimizing the CI value of the fundamental wave, variations of the CI values between the vibrating piece devices are reduced even if the base is made short, and the entire vibrating piece can be made smaller.

8 Claims, 17 Drawing Sheets

[FIG. 1]
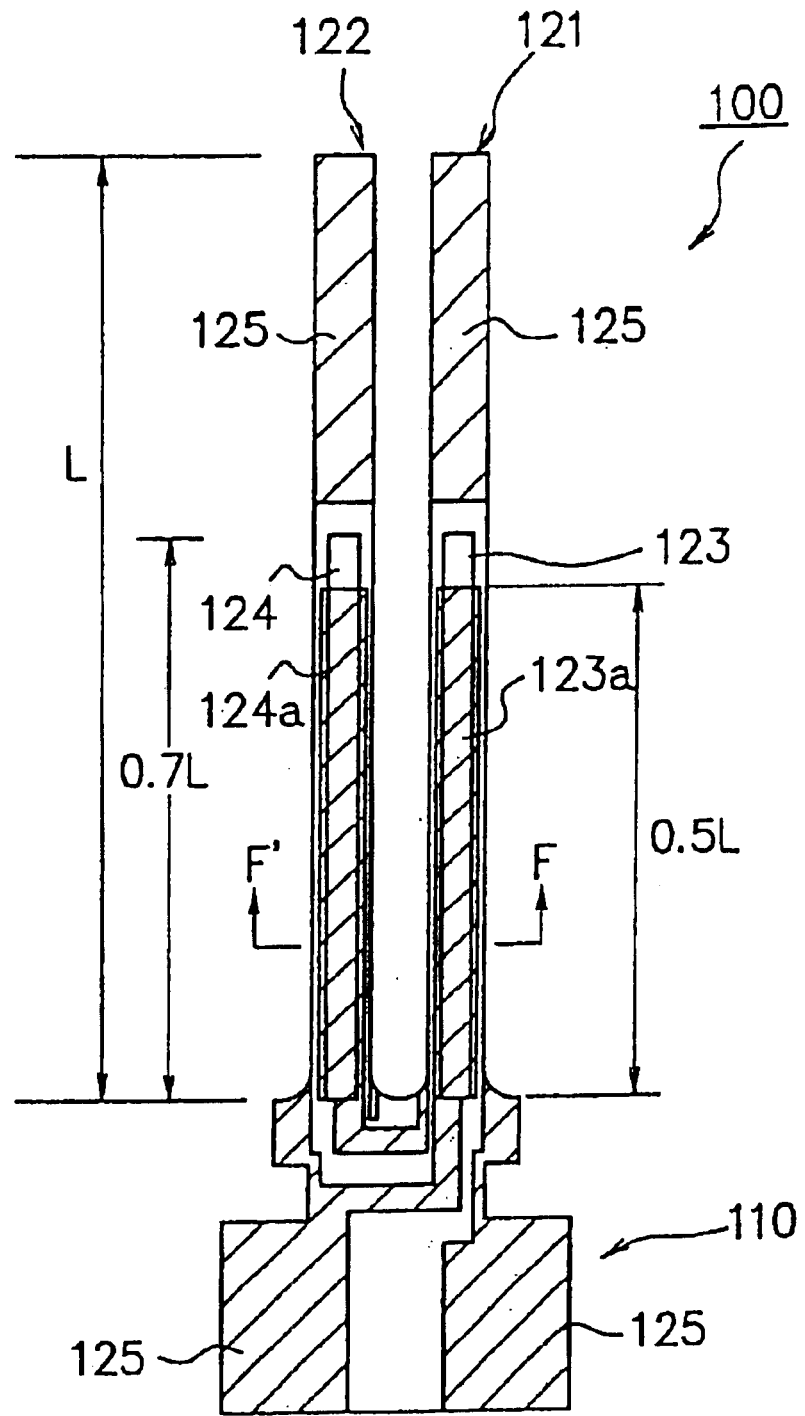

[FIG. 2]
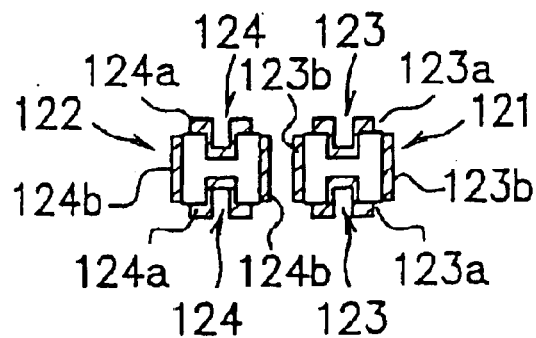
[FIG. 3]
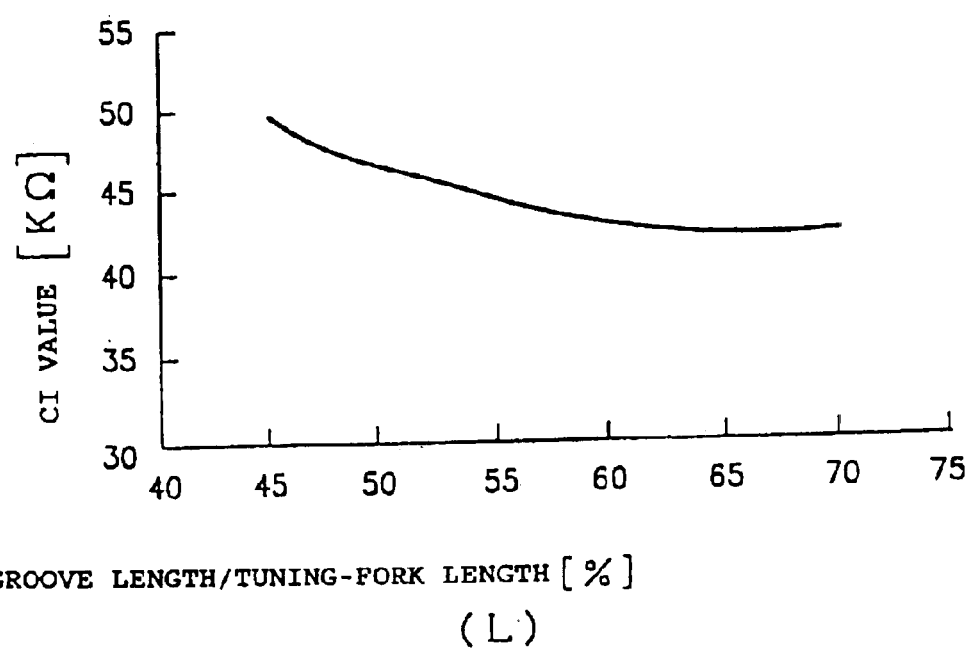

[FIG. 4]
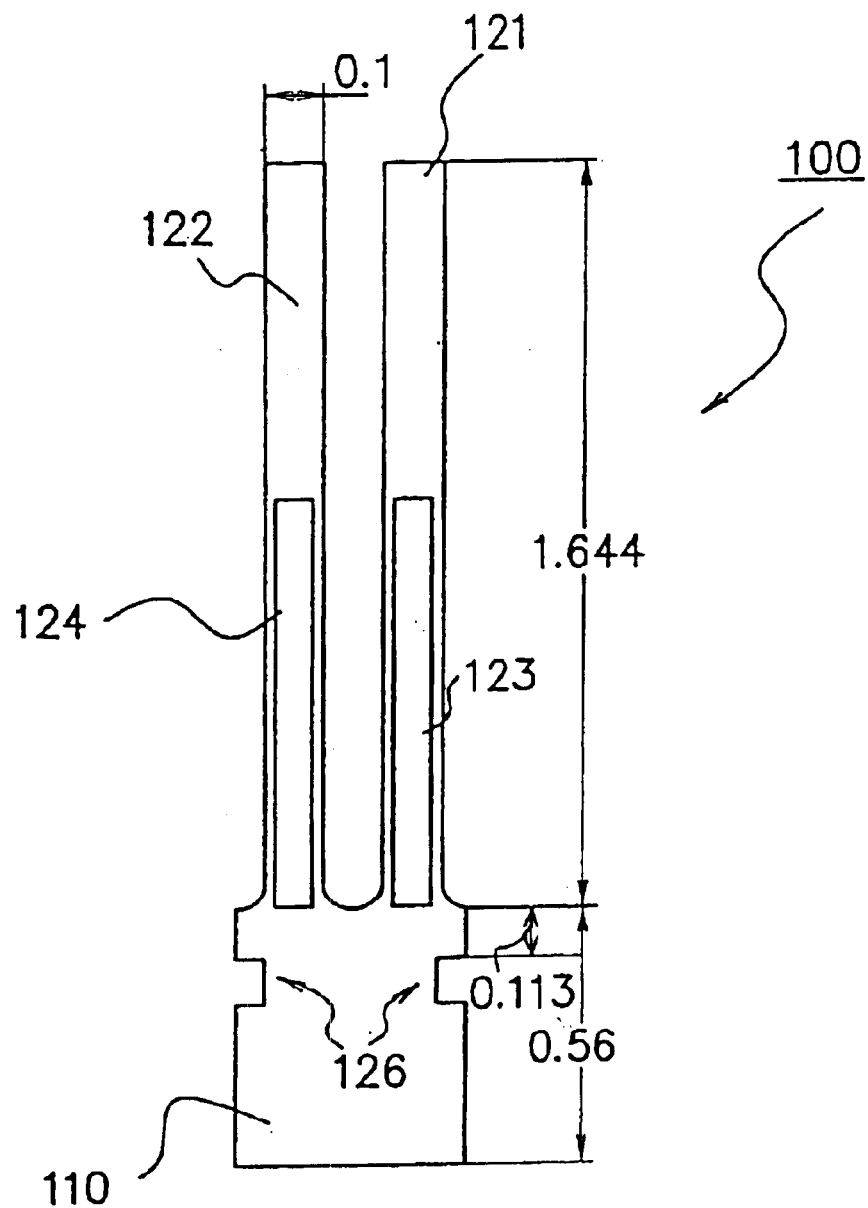

[FIG. 5]
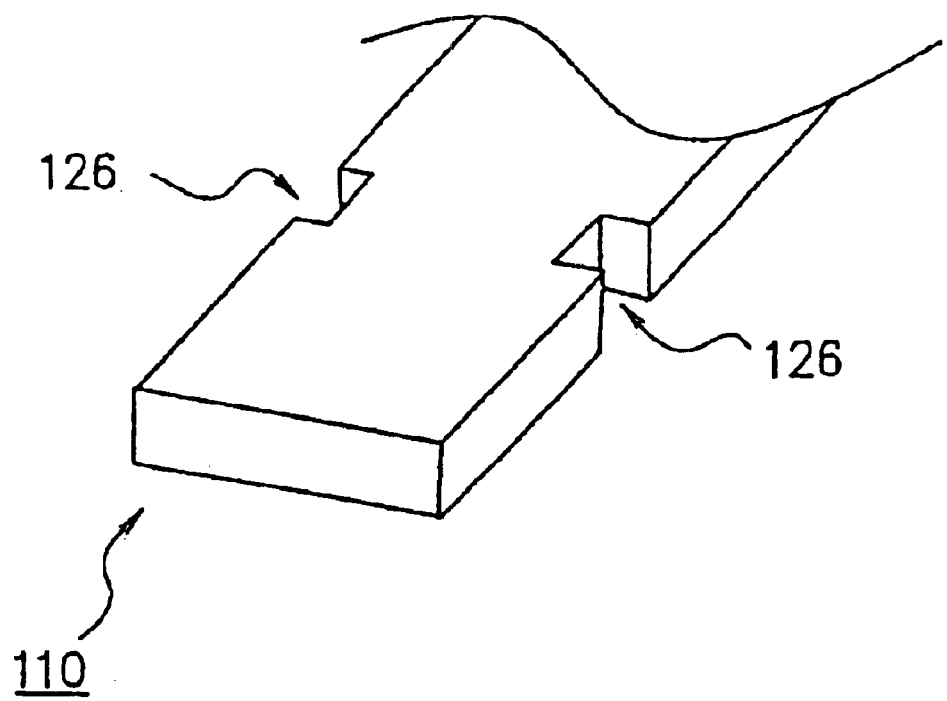

[FIG. 6]
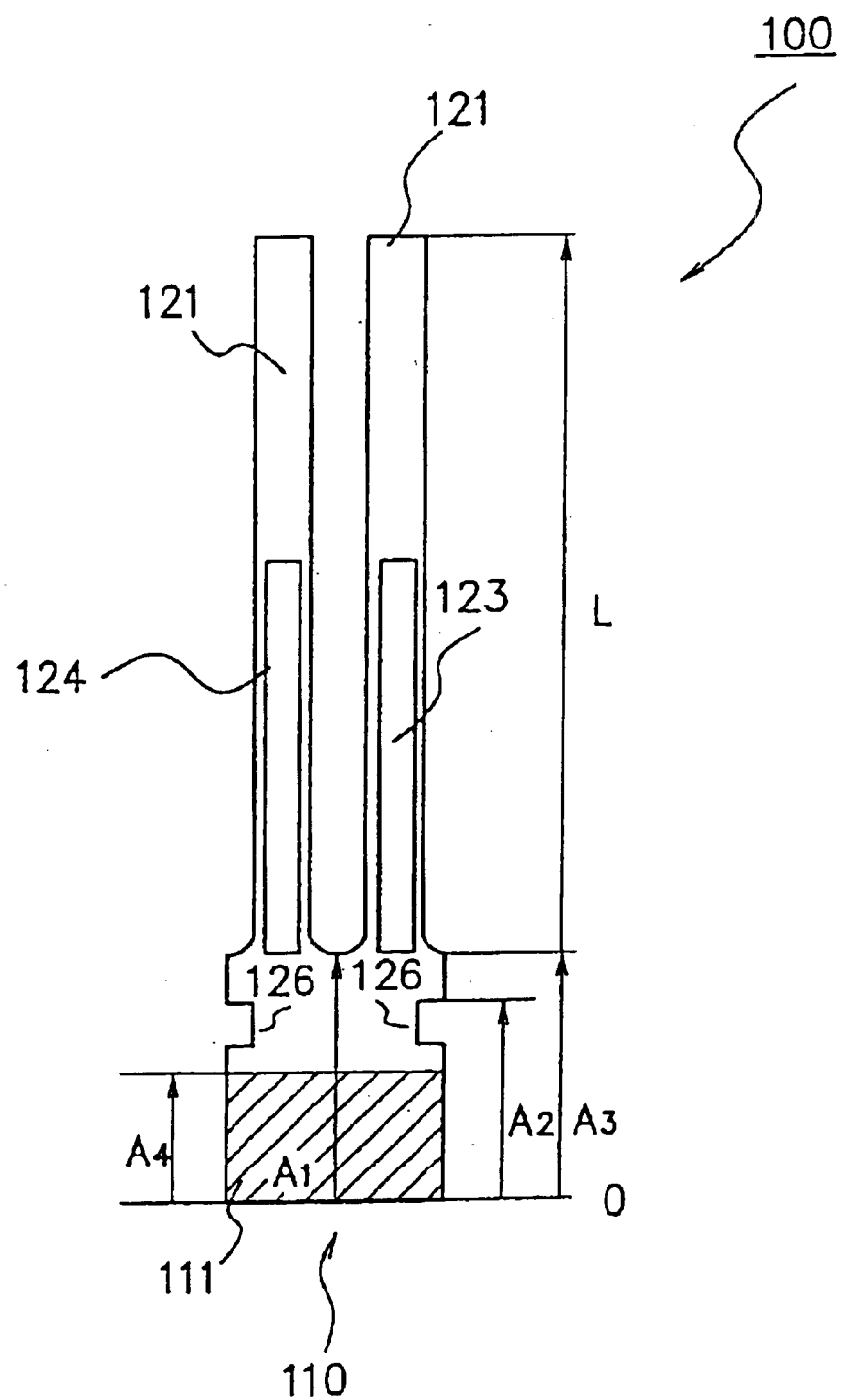

[FIG. 7]
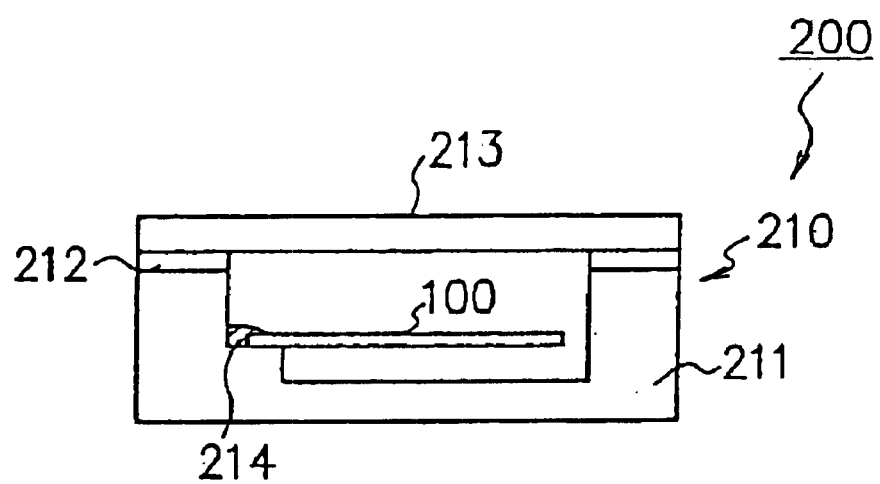

[FIG. 8]
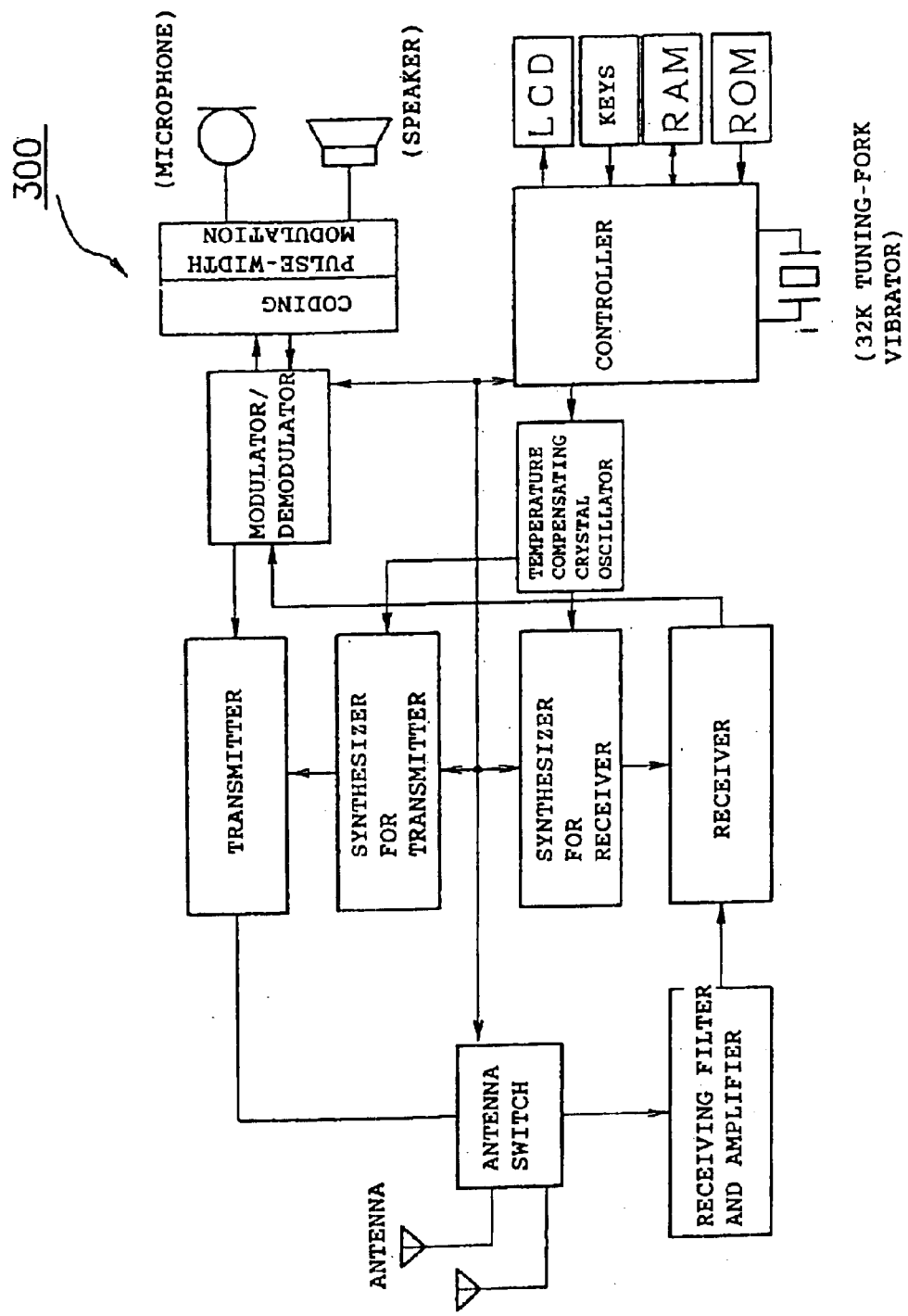

[FIG.9]
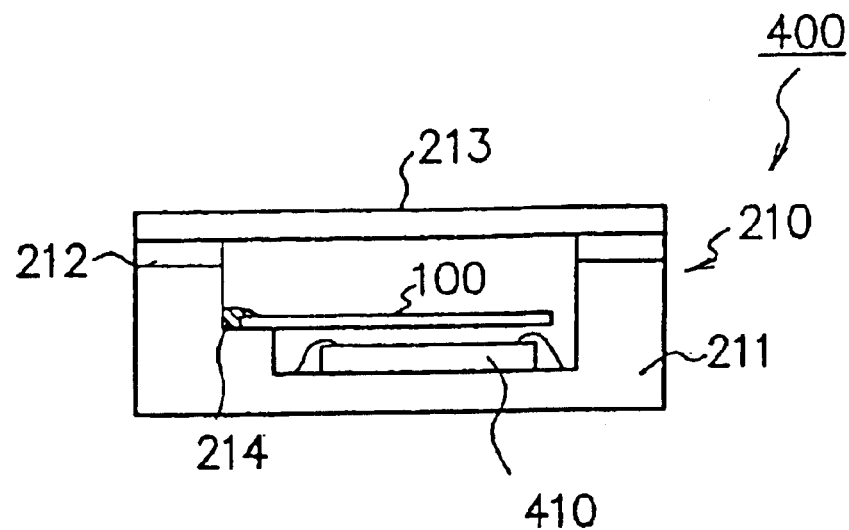
[FIG. 10]
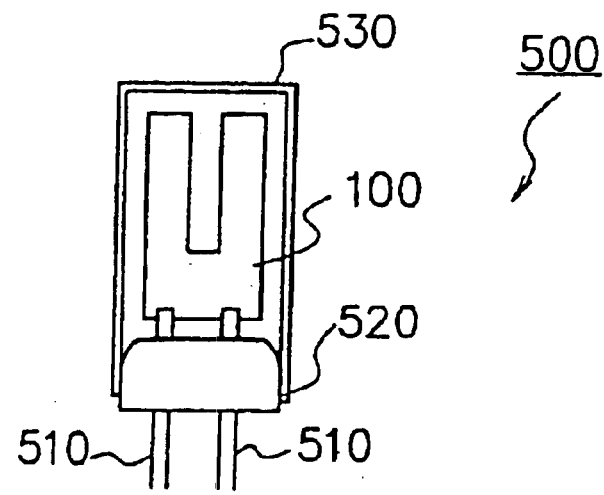

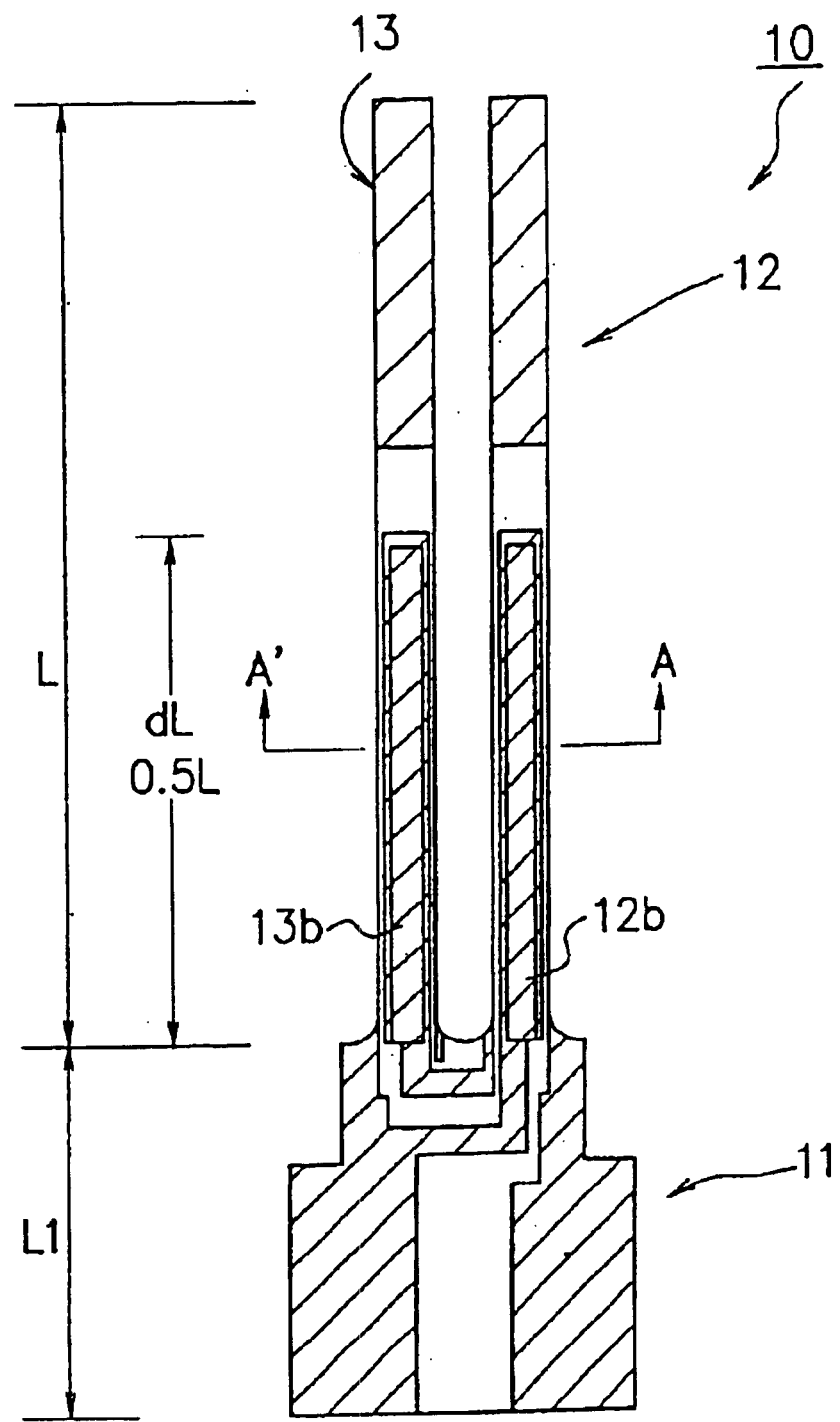
[FIG. 11]

[FIG. 12]
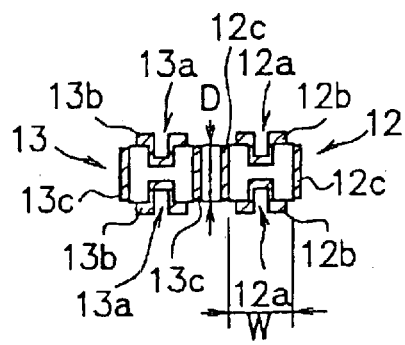
[FIG. 13]
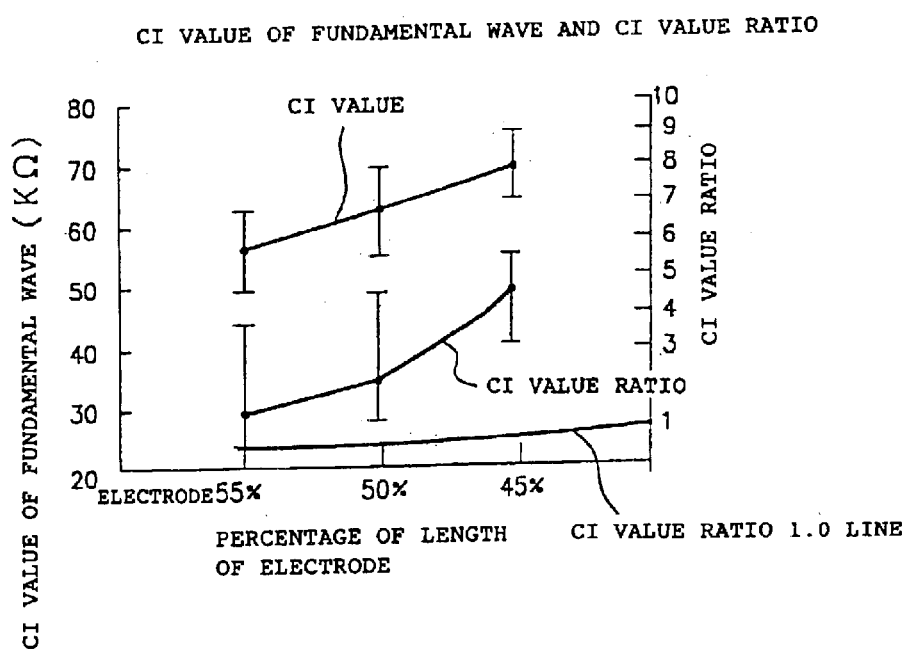

[FIG. 14]
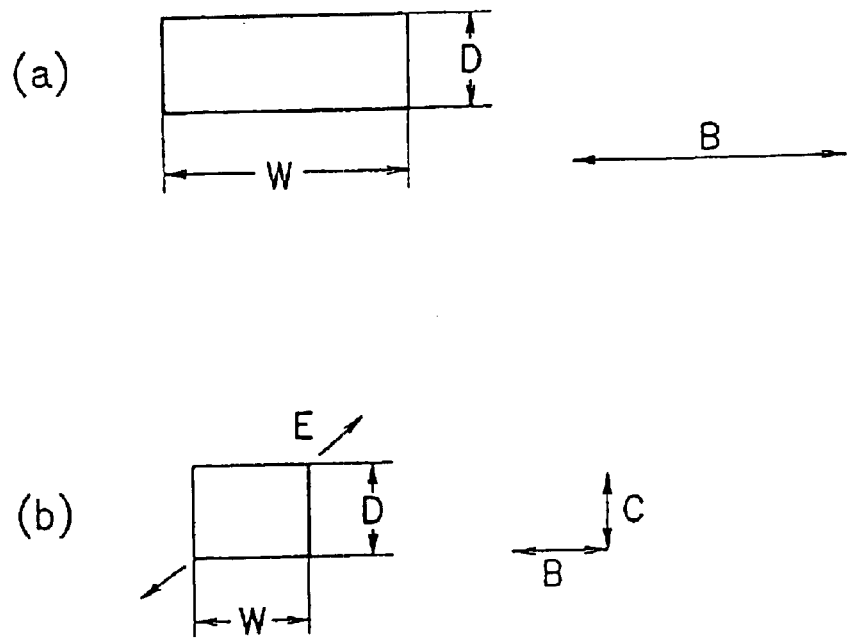
[FIG. 15]
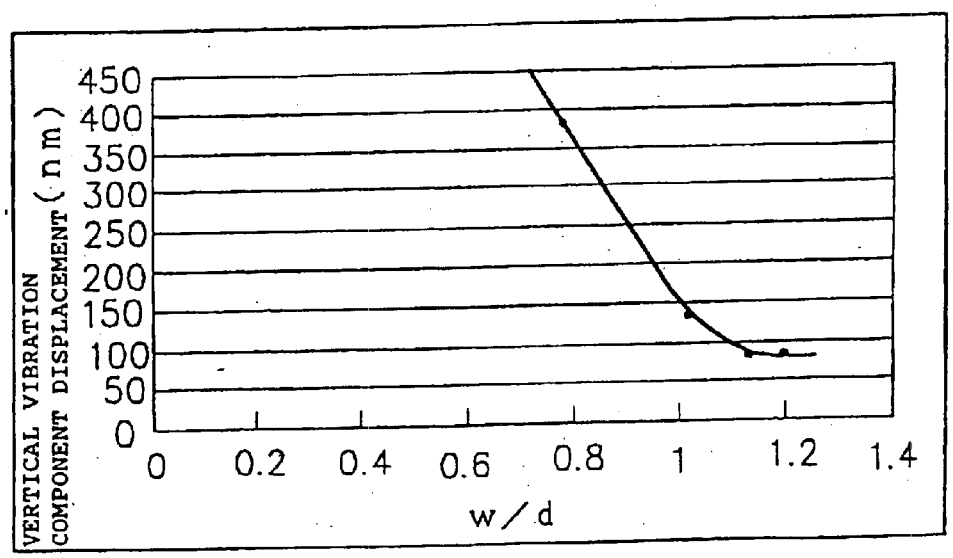

[FIG. 16]
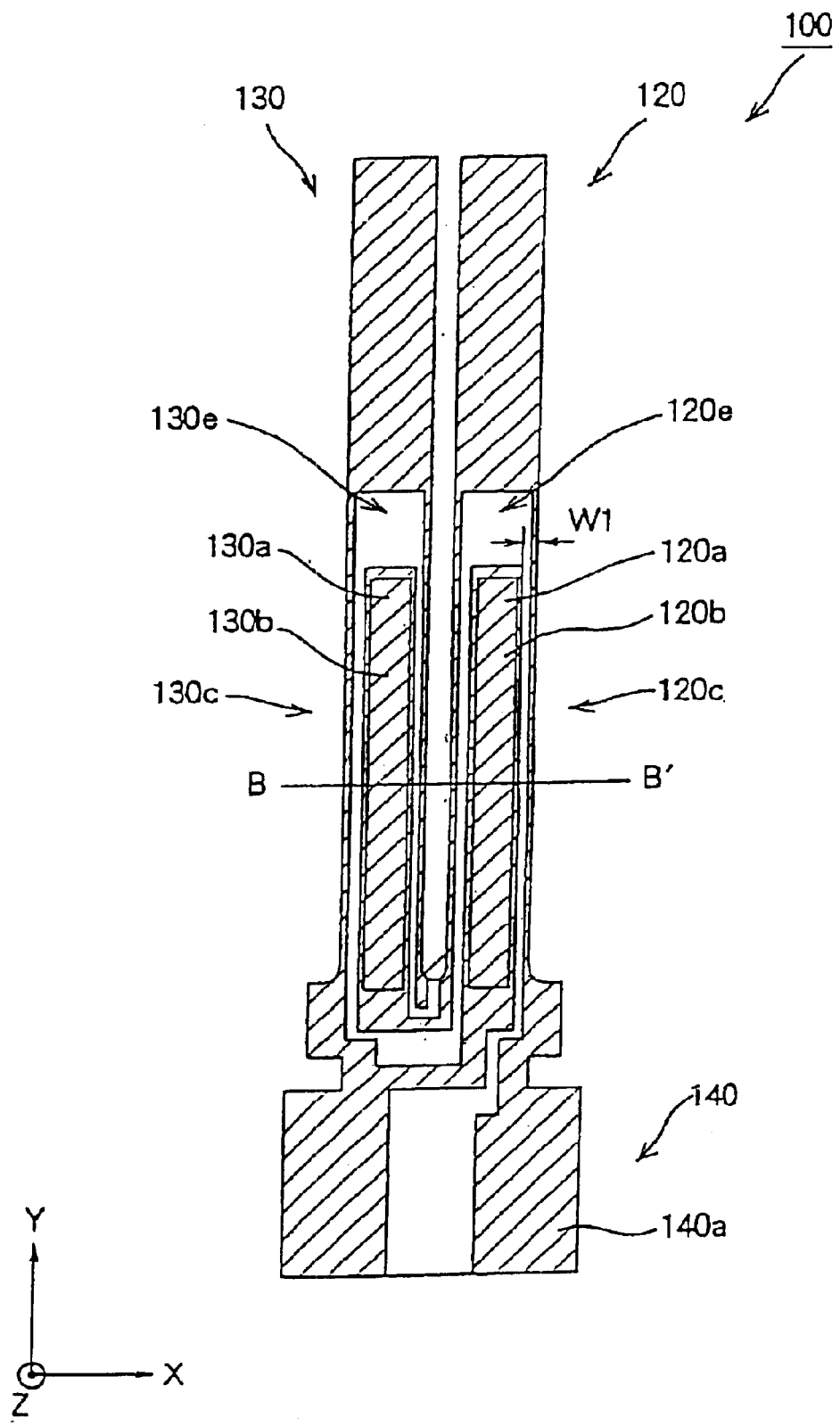

[FIG. 17]
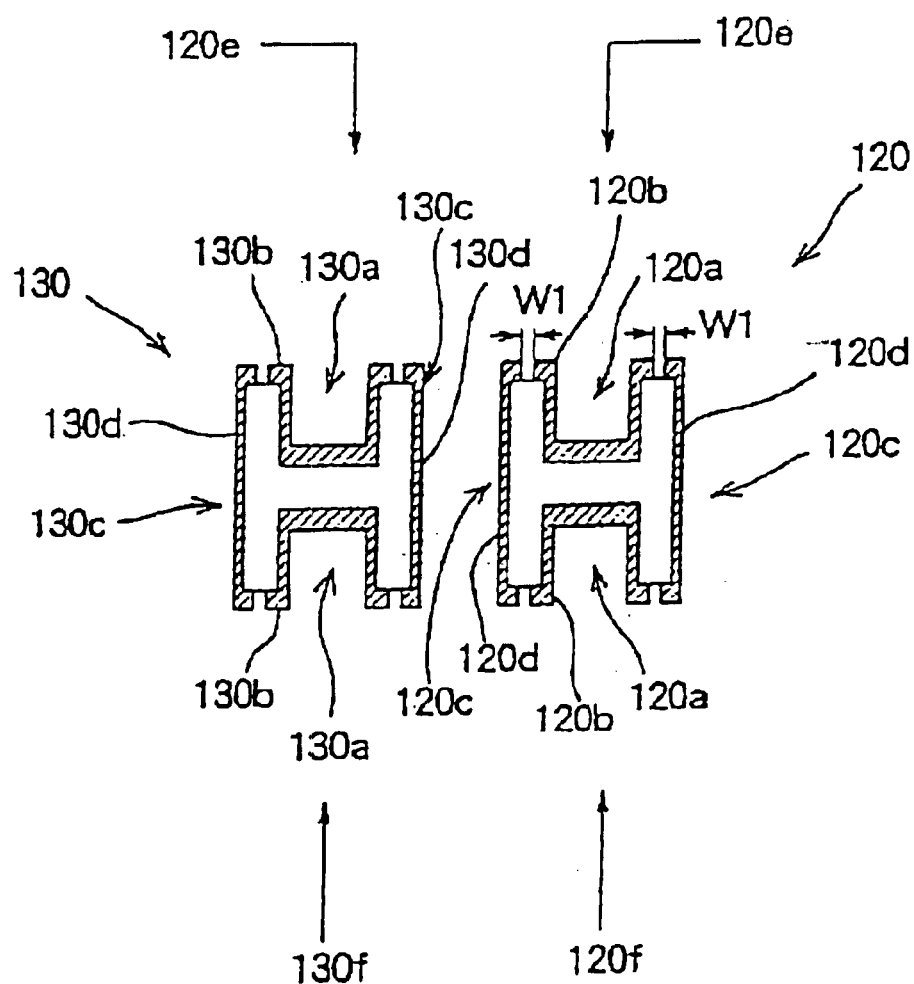

[FIG. 18]
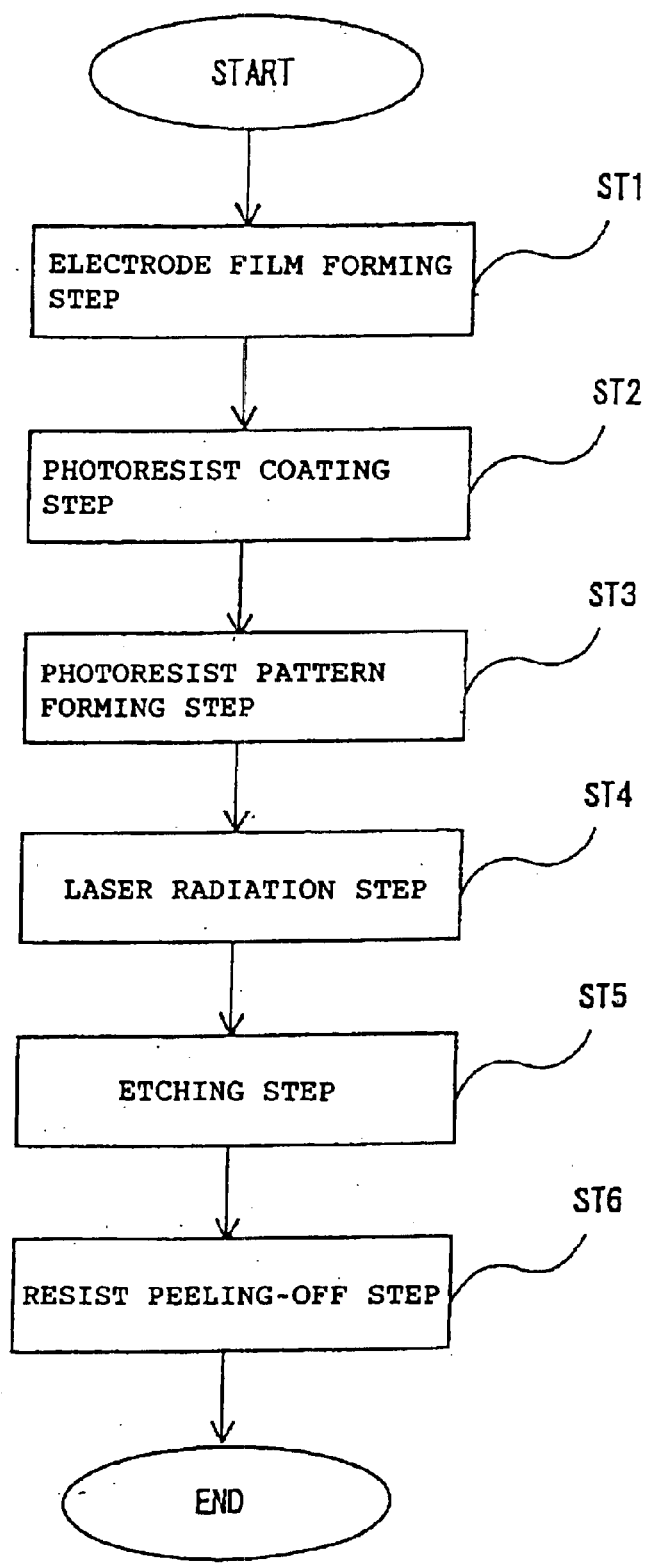

[FIG. 19]
(a)
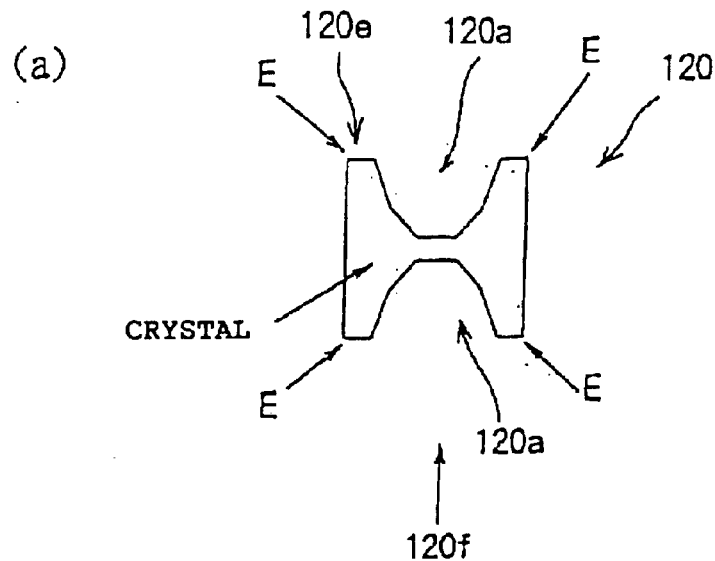
(b)
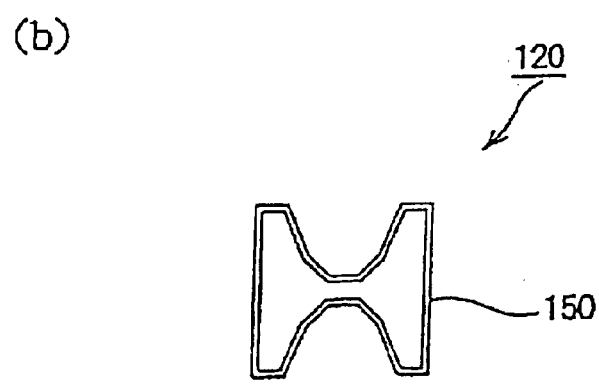
(c)
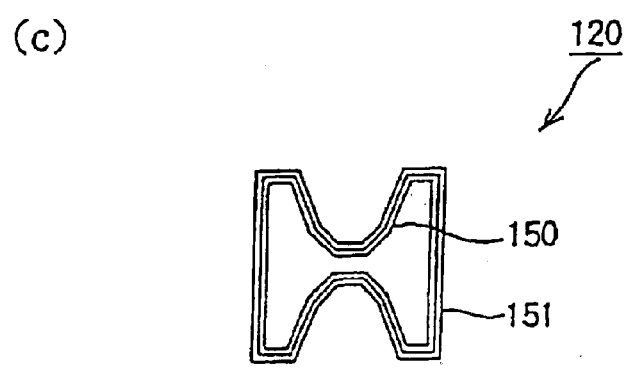

[FIG. 20]
(a)
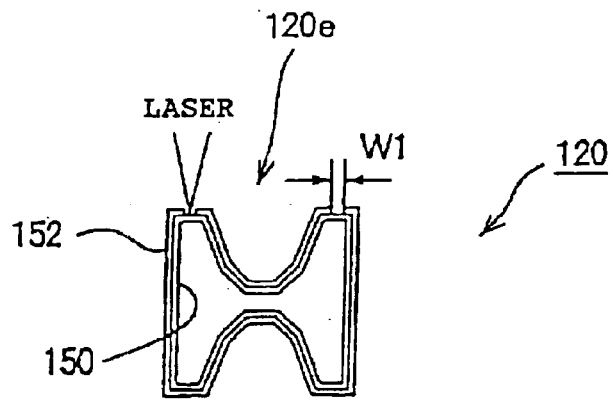
(b)
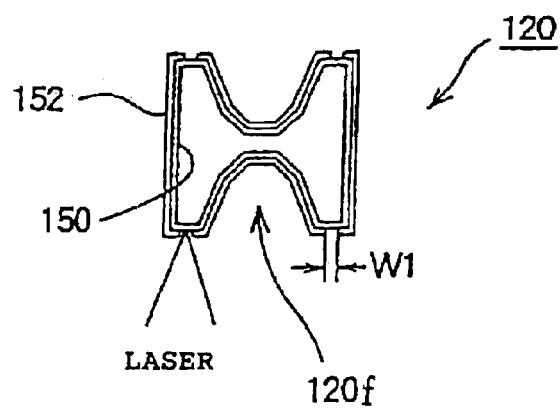
(c)
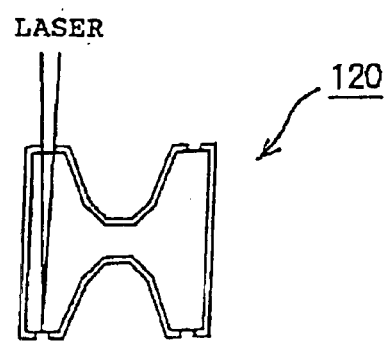

[FIG. 21]
(a)
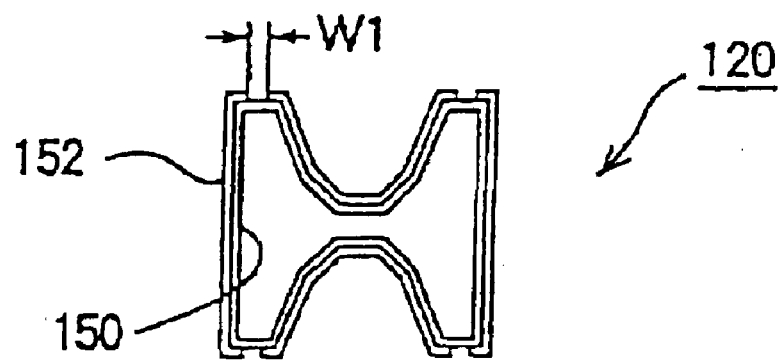
(b)
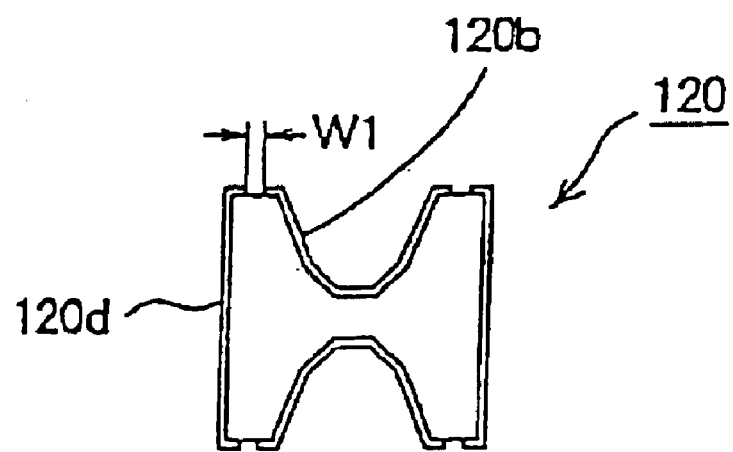

VIBRATING PIECE, VIBRATOR, OSCILLATOR, AND ELECTRONIC DEVICE

CROSS REFERENCE TO RELATED APPLICATIONS

This application is a divisional patent application of U.S. Ser. No. 10/047,420 filed Jan. 14, 2002, claiming priority to Japanese Application No. 2001-006638 filed Jan. 15, 2001, all of which are hereby incorporated by reference.

FIELD OF THE INVENTION

The present invention relates to a vibrating piece formed of, for example, a crystal, a vibrator having the vibrating piece, an oscillator having the vibrator, and an electronic device having the vibrator.

DESCRIPTION OF THE RELATED ART

Generally, a tuning-fork-type crystal vibrating piece is constructed as shown in, for example, FIG. 11.

More specifically, a tuning-fork-type crystal vibrating piece 10 comprises a base 11, and two vibration arm sections 12 and 13 formed so as to protrude from the base 11. In these two arm sections 12 and 13, grooves 12a and 13a are formed on the obverse surface and the rear surface thereof, as shown in FIG. 12.

FIG. 12 is a sectional view along the A–A' line in FIG. 11. As shown in FIG. 12, the vibration arm sections 12 and 13 are formed in such a manner that their cross section is formed in nearly an H shape from the grooves 12a and 13a.

Furthermore, such grooves 12a and 13a are formed with excitation electrodes 12b and 13b for causing these vibration arm sections 12 and 13 to vibrate, respectively, as shown in FIG. 12.

Furthermore, as shown in FIG. 12, side excitation electrodes 12c and 13c are also formed on the sides of the vibration arm sections 12 and 13, respectively.

Such a tuning-fork-type crystal vibrating piece 10 in nearly an H shape has characteristics that, even if the size of the vibrating piece is reduced, the vibration loss of the arm sections 12 and 13 is small and the CI value (crystal impedance or equivalent series resistance) can be minimized since the excitation electrodes 12b and 13b are provided within the grooves 12a and 13b.

For this reason, the tuning-fork-type crystal vibrating piece 10 in nearly an H shape is used for, for example, in particular, a vibrator requiring a high-precision performance even at a small size.

Such a tuning-fork-type crystal vibrating piece 10 has characteristics that it oscillates a signal at a frequency of a fundamental wave by the vibration thereof, and at the same time also oscillates a similar signal at a frequency of a harmonic wave.

If a device such as a vibrator picks up a signal of this harmonic wave by mistake for a signal of a frequency of a fundamental wave, this may cause the device to malfunction.

Therefore, as a method of preventing such a situation, there is a method using a CI value ratio as a reference. This CI value ratio is such that the CI value of a harmonic wave is divided by the CI value of a fundamental wave (CI value of harmonic wave/CI value of fundamental wave).

More specifically, if the CI value of the harmonic wave becomes greater than the CI value of the fundamental wave and the ratio of these CI values becomes 1.0 or more, the oscillation of the signal at the harmonic wave is unlikely to occur. Thus, the risk that a device, etc., erroneously picks up a signal of a harmonic wave becomes small, and a high-performance vibrating piece is formed.

In order to make the CI value ratio 1.0 or more in the manner described above, it is necessary to make the CI value of the harmonic wave greater. As a method therefor, it is known that the length (d1) of the excitation electrodes 12b and 13b formed in the grooves 12a and 13a is made to be half, i.e., 0.5 L, with respect to the length (L) of the vibration arm sections 12 and 13 in FIG. 11.

FIG. 13 shows the relationship between the CI value of the fundamental wave, such as the above, and the CI value ratio. As shown in FIG. 13, the shorter the length (d1) of the excitation electrodes 12b and 13b becomes with respect to the length (L) of the vibration arm sections 12 and 13 the more the CI value of the fundamental wave is increased, and thereby the CI value ratio is also increased.

In contrast, the longer the length (d1) of the excitation electrodes 12b and 13b becomes with respect to the length (L) of the vibration arm sections 12 and 13 the more the CI value of the fundamental wave is decreased, and at the same time, also, the CI value ratio approaches 1.0. For example, when the length (d1) of the excitation electrodes 12b and 13b becomes 60% of the length (L) of the vibration arm sections 12 and 13, the CI value ratio becomes 1.0 or less.

Therefore, in the manner described above, the length (d1) of the excitation electrodes 12b and 13b is made to be about half of the length (L) of the vibration arm sections 12 and 13.

As a result of the above, the CI value of the harmonic wave and the CI value of the fundamental wave of the vibrating reed are increased. However, at the same time, since the CI value of the harmonic wave becomes greater than the CI value of the fundamental wave, the difference between their CI values is increased and thus the CI value ratio can be made to be 1.0 or more(see FIG. 13).

As a consequence, by making the CI value ratio to be 1.0 or more in this manner, a vibrator incorporating the tuning-fork-type crystal vibrating piece 10 is unlikely to erroneously pick up a signal of a harmonic wave, and a small high-performance vibrating reed is formed.

When the CI value of the harmonic wave is increased in the manner described above, the CI value of the fundamental wave is increased even though this increase is not so large as that of the harmonic wave.

In this fundamental wave, if the CI value becomes too great, the performance of the vibrating piece may be caused to deteriorate. For this reason, since the CI value ratio is made to be 1.0 or more, the CI value of the harmonic wave cannot be made significantly greater.

However, if the CI value of the harmonic wave is increased to such a degree that the CI value of the fundamental wave is not increased too much, it is not easy to make CI value ratio to be 1.0 or more. Therefore, a problem inevitably arises in that the CI value of the fundamental wave is increased more than necessary.

Furthermore, for even such a small tuning-fork-type crystal vibrating piece 10, there has been a demand for its further miniaturization in order to meet a demand for the miniaturization of a device such as an electrical device in recent years.

The best way to meet such a demand for this miniaturization is; the longitudinal length (L1) of the base 11 in FIG. 11 is formed shorter, the length of the vibrating piece 10 becomes shorter as a whole, and thus the vibrating piece 10 becomes smaller. However, there are problems described below.

That is, generally, unless the length of the base 11 is made to be 40% or more of the length of the vibration arm sections 12 and 13, the CI value is not stabilized, and a problem arises in that the performance of the vibrating piece is deteriorated.

More specifically, as shown in FIG. 12, when the thickness of the vibration arm sections 12 and 13 is denoted as D, the width of the vibration arm sections 12 and 13 is denoted as W, and the length of the vibration arm sections 12 and 13 is denoted as L, the frequency f of the tuning-fork-type crystal vibrating piece 10 must satisfy the following equation:

$$f \propto W/L^2 \qquad \text{Equation 1}$$

That is, there is a relation that the shorter the length L of the vibration arm sections 12 and 13 of the vibrating piece 10 is, the narrower the width W of the vibration arm sections 12 and 13 becomes.

Since the tuning-fork-type crystal vibrating piece 10 shown in FIG. 11 is miniaturized as described above and thus the length L of the vibration arm sections 12 and 13 is as short as 1.644 mm, the width thereof is very narrow, for example, 0.1 mm. Furthermore, the thickness D of the vibration arm sections 12 and 13 is formed to be, for example, 0.1 mm.

As shown in FIG. 13(a), in the arm sections 12 and 13 of the tuning-fork-type crystal vibrating piece 10, if the width W is large and the thickness D is small, they perform a normal horizontal vibration, as indicated by the arrow B in the figure.

However, if the width W becomes smaller as described above, as shown in FIG. 14(b), the vibration contains components in the vertical direction (the direction of the arrow C in the figure), and the vibration arm sections 12 and 13 vibrate in the direction indicated by the arrow E in FIG. 14(b).

As is clear from FIG. 15, it can be seen that the vertical vibration component displacement quantity (nm) increases sharply when the width W/thickness D of the vibration arm sections 12 and 13 becomes smaller than 1.2.

When the vertical components of the vibration of the vibration arm sections 12 and 13 are increased in this manner, this vibration is propagated to the base 11 of the vibrating reed 10, and energy escapes from the bonding agent, etc., of the fixation area of the base 11 by which the vibrating piece 10 is fixed to a package, etc.

In this manner, when the vibration leaks to the base 11 and energy escapes from the fixation area of the base 11, the vibration of the vibration arm sections 12 and 13 becomes unstable., and variations of the CI values between the vibrating piece devices become large.

In order to prevent such leakage of the vibration of the vibration arm sections 12 and 13 and such escape of energy from the fixation area of the base 11, a length of 40% or more of the length L of the vibration arm sections 12 and 13 must be provided to the base 11 in the manner described above. As a consequence, this has been an obstacle for reducing the size of the vibrating piece 10 itself.

SUMMARY OF THE INVENTION

An object of the present invention is to provide a vibrating reed in which the ratio of CI values is maintained constant while minimizing the CI value of the fundamental wave such that variations of the CI values between the vibrating piece devices are reduced even if the base is made short, and the entire vibrating piece can be made smaller.

According to the present invention, preferably, vibrating pieces from (1) to (6) below are provided.

(1) A vibrating reed comprising: a base; and a vibration arm section formed so as to protrude from this base, a grooved portion being formed in at least one of the obverse surface and the rear surface of the vibration arm section, wherein a cut section is formed in the base, and an electrode section is formed in a part of the grooved portion.

(2) A vibrating piece, wherein a grooved portion is formed in at least one of the obverse surface and the rear surface of the vibration arm section, and an electrode section is formed in a part of the grooved portion so that the CI value ratio (crystal impedance) of the vibrating piece(CI value of the harmonic wave/CI value of the fundamental wave) becomes 1.0 or more.

(3) A vibrating piece, wherein the length of the electrode section formed in a part of the grooved portion of the vibration arm section along the longitudinal direction is formed to be approximately 45% to approximately 55% with respect to the length of the vibration arm section.

(4) A vibrating piece, wherein the electrode section is an excitation electrode.

(5) A vibrating piece, wherein a fixation area for fixing the vibrating reed is provided in the base, and the cut section is provided in the base between the fixation area and the vibration arm section.

(6) A vibrating piece, wherein the vibrating reed is a tuning-fork vibrating piece formed by a crystal which oscillates at approximately 30 kHz to approximately 40 kHz.

BRIEF DESCRIPTION OF THE DRAWINGS

FIG. 1 is a schematic view of a tuning-fork-type crystal vibrating piece according to a first embodiment of the present invention.

FIG. 2 is a sectional view along the line F–F' in FIG. 1.

FIG. 3 shows the relationship between the CI value of the fundamental wave and the length of a groove.

FIG. 4 shows the dimensions of the tuning-fork-type crystal vibrating piece of FIG. 1.

FIG. 5 is a schematic perspective view showing the construction of a cut section of a base of FIG. 4.

FIG. 6 is an illustration of a tuning-fork-type crystal vibrator of FIG. 4.

FIG. 7 is a schematic sectional view showing the construction of a ceramic-packaged tuning-fork-type vibrator according to a second embodiment of the present invention.

FIG. 8 is a schematic view showing the circuit blocks of a portable digital phone according to a third embodiment of the present invention.

FIG. 9 is a schematic sectional view showing the construction of a tuning-fork crystal oscillator according to a fourth embodiment of the present invention.

FIG. 10 is a schematic sectional view showing the construction of a cylinder-type tuning-fork vibrator according to a fifth embodiment of the present invention.

FIG. 11 is a schematic view showing a conventional tuning-fork-type crystal vibrating piece.

FIG. 12 is a schematic sectional view along the line A–A' in FIG. 11.

FIG. 13 shows the relationship between the CI value of the fundamental wave and the CI value ratio.

FIG. 14(a) is an illustration of the vibration of a vibration arm section. FIG. 14(b) is another illustration of the vibration of the vibration arm section.

FIG. 15 shows the relationship between the vibration arm section and a vertical vibration component displacement quantity.

FIG. 16 is a schematic view showing a tuning-fork-type crystal vibrating piece 100 manufactured by a method of manufacturing the vibrating piece according to the first embodiment of the present invention.

FIG. 17 is a schematic sectional view along the line B–B' in FIG. 16.

FIG. 18 is a general flowchart showing electrode forming steps.

FIG. 19 includes schematic views showing steps in which an electrode is formed in a tuning-fork arm.

FIG. 20 includes schematic views showing other steps in which an electrode is formed in a tuning-fork arm.

FIG. 21 includes schematic views showing other steps in which an electrode is formed in a tuning-fork arm.

DESCRIPTION OF THE EMBODIMENTS

Regarding each aspect of the invention of the above-described (1) to (6), preferably, the following embodiments are provided. However, the present invention is not limited to these embodiments.

A vibrator having a vibrating piece housed in a package, the vibrating reed comprising: a base; and a vibration arm section formed so as to protrude from this base, a grooved portion being formed in at least one of the obverse surface and the rear surface of the vibration arm section, wherein a cut section is formed in the base, and an electrode section is formed in a part of the grooved portion.

A vibrator, wherein a grooved portion is formed in at least one of the obverse surface and the rear surface of the vibration arm section, and an electrode section is formed in a part of the grooved portion so that the CI (crystal impedance) value ratio of the vibrating piece (CI value of the harmonic wave/CI value of the fundamental wave) becomes 1.0 or more.

A vibrator, wherein the length of the electrode section formed in a part of the grooved portion of the vibration arm section along the longitudinal direction is formed to be approximately 45% to approximately 55% with respect to the length of the vibration arm section.

A vibrator, wherein the electrode section is an excitation electrode.

A vibrator, wherein a fixation area for fixing the vibrating piece is provided in the base, and the cut section is provided in the base between the fixation area and the vibration arm section.

A vibrator, wherein the vibrating piece is a tuning-fork vibrating reed formed by a crystal which oscillates at approximately 30 kHz to approximately 40 kHz.

A vibrator, wherein the package is formed in a box shape.

A vibrator, wherein the package is formed in a commonly-called cylinder type.

An oscillator having a vibrating piece and an integrated circuit housed in a package, the vibrating piece comprising: a base; and a vibration arm section formed so as to protrude from this base, wherein a cut section is formed in the base, and an electrode section is formed in a part of the grooved portion, of the vibrating reed.

An electronic device using an vibrator which is connected to a control section, the vibrator having a vibrating piece housed in a package, the vibrating piece comprising: a base; and a vibration arm section formed so as to protrude from this base, wherein a cut section is formed in the base, and an electrode section is formed in a part of the grooved portion, of the vibrating reed.

The embodiments of a vibrating reed of the present invention will be described below in more detail with reference to the drawings.

FIG. 1 shows a tuning-fork-type crystal vibrating piece 100 which is a vibrating piece according to a first embodiment of the present invention.

The tuning-fork-type crystal vibrating piece 100 is formed in such a manner that a single quartz crystal is cut out so as to be formed as, for example, a commonly-called Z-plate crystal. Furthermore, since the tuning-fork-type crystal vibrating piece 100 shown in FIG. 1 is a vibrating piece which generates a signal at, for example, 32.768 kHz, it is formed to be very small.

Such a tuning-fork-type crystal vibrating piece 100, as shown in FIG. 1, has a base 110. Two tuning-fork arms 121 and 122, which are vibration arm sections, are arranged in such a manner as to protrude upward from the base 110 in the figure.

Furthermore, grooved portions 123 and 124 are formed on the obverse surfaces and the rear surfaces of the tuning-fork arms 121 and 122, as shown in FIG. 1. Similarly, since the grooved portions 123 and 124 are also formed on the rear surfaces of the tuning-fork arms 121 and 122 (not shown in FIG. 1), these are formed into nearly an H shape in the F–F' sectional view of FIG. 1, as shown in FIG. 2.

In the grooved portions 123 and 124 formed in tuning-fork arms 121 and 122 shown in FIG. 1, excitation electrodes 123a and 124a, which are electrode sections, are formed, as shown in FIGS. 1 and 2.

Furthermore, as shown in FIG. 2, side excitation electrodes 123b and 124b are arranged on the side of the tuning-fork-type crystal vibrating piece 100.

In addition, another electrode 125 for supplying power is arranged in the tuning-fork-type crystal vibrating piece 100.

Since the excitation electrodes 123a and 124a are arranged in the grooved portions 123 and 124, and the side excitation electrodes 123b and 124b are arranged on the side thereof, when a voltage is applied to the excitation electrodes 123a and 124a and the side excitation electrodes 123b and 124b, an electric field is generated efficiently within the tuning-fork arms 123 and 124, and thus vibration is produced in a state in which the vibration loss of the tuning-fork arms 123 and 124 is low and the CI value (crystal impedance or equivalent series resistance) is low.

This CI value indicates specifically a fundamental wave, and the frequency is, for example, 32 kHz. As a result of minimizing the CI value of the fundamental wave, a high-performance vibrating piece is formed.

The length of the grooved portions 123 and 124 where the excitation electrodes 123a and 124a are arranged is set to 0.7 L, which is the length of 70% with respect to the length (L) of the tuning-fork arms 121 and 122, as shown in FIG. 1.

The length of this 0.7 L is a length at which the CI value of the fundamental wave becomes lowest, as in FIG. 3 showing the relationship between the CI value of the fundamental wave and the length of a groove.

In a part of the grooved portions 123 and 124 which are arranged in such a length, as shown in FIGS. 1 and 2, excitation electrodes 123a and 124a are arranged.

The excitation electrodes 123a and 124a are not arranged over the entire grooved portions 123 and 124, but rather, has a length of 50% with respect to the length (L) of the tuning-fork arms 121 and 122.

This ratio, as shown in FIG. 13, indicates an arrangement where the CI value ratio (CI value of the harmonic wave/CI value of the fundamental wave) becomes 1.0 or more. As a result of such an arrangement, since the CI value of the harmonic wave becomes greater in the manner described above, and an erroneous oscillation becomes unlikely to occur at a harmonic wave, the vibrator incorporating the tuning-fork-type crystal vibrating piece 100 becomes susceptible to the oscillation of the fundamental wave.

When the tuning-fork arms 121 and 122 vibrate as described above, a possibility arises in which not only an oscillation at a fundamental wave, but also an oscillation at a harmonic wave occurs.

However, according to this embodiment, the length of the grooved portions 123 and 124 is set to such a length (0.7 L) as that in which the CI value of the fundamental wave is decreased, and the length of the excitation electrodes 123a and 124a is set to such a length (0.5 L) as that in which the CI value ratio becomes 1.0 or more. Therefore, it becomes possible to make the oscillation of the harmonic wave unlikely to occur and to minimize the CI value of the fundamental wave.

That is, unlike a conventional tuning-fork-type crystal vibrating piece 10, since the excitation electrodes 123a and 124a are not arranged in the entire grooved portions 123 and 124 and a portion where the excitation electrodes 123a and 124a are not arranged is provided in the grooved portions 123 and 124, such adjustment becomes possible.

In FIG. 1, below the tuning-fork arms 121 and 122 where the grooved portions 123 and 124 and the excitation electrodes 123a and 124a are arranged in this manner, the base 110 is arranged as described above.

The entirety of this base 110 is formed in nearly a plate shape. The length along the longitudinal direction in the figure is formed to be, for example, 0.56 mm, as shown in FIG. 4.

FIG. 4 shows the dimensions, etc., of the tuning-fork-type crystal vibrating piece 100 of FIG. 1.

As shown in FIG. 4, the length of the tuning-fork arms 121 and 122 arranged so as to protrude from the base 110 along the longitudinal direction is formed to be, for example, 1.644 mm.

As a consequence, the length of the base 110 with respect to the tuning-fork arms 121 and 122 is about 34%. In comparison, the conventional tuning-fork-type crystal vibrating piece 10 is formed in such a way that the length (L1) of the base 11 is 0.7 mm, the length (L) of the arm sections 12 and 13 is 1.644 mm. The length of the base 11 becomes about 42.6% with respect to the length of the arm sections 12 and 13, and this exceeds 40%.

In this manner, the length of the base 11 is made to be a length of 40% or more with respect to the length of the arm sections 12 and 13, and thus prevented are vibration leakage due to the vibration of the vertical components of the arm sections 12 and 13, and large variations of the CI values between the vibrating piece devices.

In contrast, since the length of the base 110 of the tuning-fork-type crystal vibrating piece 100 of this embodiment is formed to be 34% with respect to the length of the tuning-fork arms 121 and 122 as described above, in the construction similar to the conventional tuning-fork-type crystal vibrating reed 10, vibration leakage due to the vibration of the vertical components of the arm sections 12 and 13 occurs, and variations of the CI values between the vibrating piece devices become large.

However, in this embodiment, as shown in FIG. 4, two cut sections 126 are provided on both sides of the base 110.

FIG. 5 shows this state. FIG. 5 is a schematic perspective view showing a state in which the cut sections 126 of the base 110 of FIG. 4 are arranged.

As shown in FIG. 5, the cut sections 126 are formed in a rectangular shape.

Such a cut section 126 is formed downward from the lower portion by 0.113 mm from the upper end portion of the base 110, as shown in FIG. 4.

FIG. 6 shows the arrangement conditions of the cut section 126 in the base 110.

In FIG. 6, the length from the bottom of the base 110 to the upper end of the base 110, specifically, to the crotch portion between the two tuning-fork arms 121 and 122, is denoted as A1.

Then, the length from the bottom of the base 110 to the upper end portion of the cut section 126 is denoted as A2.

Furthermore, when the length from the bottom of the base 110 to the lower end portion of the grooved portions 123 and 124 formed in the tuning-fork arms 121 and 122 is denoted as A3, the cut section 126 is formed in such a way that the length A3 is longer than the length A2.

Then, the construction is formed in such a way that the length of A3 is formed to be the same as the length A1 or is longer than the length of A1. Therefore, the grooved portions 123 and 124 are not formed on the bottom side of the base 110 from the root of the tuning-fork arms 121 and 122.

From the above relation, the position of the cut section 126 formed in the base 110 will always be at a portion lower than the lower end portion of the grooved portions 123 and 124 of the tuning-fork arms 121 and 122.

Therefore, the presence of the cut section 126 does not hinder the vibration of the tuning-fork arm sections 121 and 122.

Furthermore, the portion indicated with oblique lines in FIG. 6 is a fixation area 111 which is actually fixed when the tuning-fork-type crystal vibrating piece 100 is fixed in a package. A4 indicates the distance between the upper end portion of the fixation area 111 and the bottom of the base 110.

The positional relationship between the fixation area 111 and the cut section 126 is such that the length A2 becomes always longer than the length A4.

Therefore, since the upper end portion of the cut section 126 is always positioned at a portion higher than the fixation area 111 in FIG. 4, the cut section 126 does not exert an influence on the fixation area 111, and thus no adverse influence is exerted on the fixed state of the tuning-fork-type crystal vibrating piece 100 with respect to the package.

As described above, the cut sections 126 provided in the base 110 are provided at positions where no adverse influence is exerted on the vibration of the tuning-fork arms 121 and 122 of the tuning-fork-type crystal vibrating piece 100. Furthermore, the cut sections 126 are also provided at positions where no adverse influence is exerted on the fixed state of the tuning-fork-type crystal vibrating piece 100 with respect to the package. The cut sections 126 provided at such positions are provided on the base 110 side below the position of the grooved portions 123 and 124 of the tuning-fork arms 121 and 122. As a consequence, the cut section 126 makes it difficult for leakage vibration leaking from the grooved portions 123 and 124 due to the vibration of the tuning-fork arms 121 and 122 to propagate to the fixation area 111 of the base 110.

Therefore, it becomes unlikely that the leakage vibration propagates to the fixation area 111 and energy escape occurs. Thus, an increase in variations of the CI values between the vibrating piece devices can be effectively prevented.

As described above, since variations of the CI values between the vibrating piece devices can be reduced, it is not necessary to make the length of the base 11 to be 40% or more of the length of the arm sections 12 and 13 as in the conventional tuning-fork-type crystal vibrating piece 10.

In this embodiment, as shown in FIG. 1, even if the length of the base 110 of the tuning-fork-type crystal vibrating piece 100 is formed so as to be 34% with respect to the length of the tuning-fork arms 121 and 122 in the manner described above, vibration leakage due to the vibration of the vertical components of the tuning-fork arms 121 and 122 becomes unlikely to occur, and variations of the CI values between the vibrating piece devices are reduced. As a result, the length of the base 110 can be shortened, and the size of the tuning-fork-type crystal vibrating piece 100 can be reduced.

In this embodiment, the length of the base 110 can be made to be 0.56 mm as shown in FIG. 4, and thus it can be considerably smaller than 0.7 mm, which is the length (L1) of the length of the base 11 shown in FIG. 12 of the conventional tuning-fork-type crystal vibrating piece 10.

The respective widths of the tuning-fork arms 121 and 122 are formed to be 0.1 mm as shown in FIG. 4. The reason why the arm widths of the tuning-fork arms 121 and 122 are formed considerably narrower in this manner is that the length (L) of the tuning-fork arms 121 and 122 are shortened as stated in detail in the description [f∝W/L²] which is the above-described equation 1.

More specifically, in order to shorten the length of the, tuning-fork arms 121 and 122 to be 1.644 mm as shown in FIG. 4, the arm width must be 0.1 mm based on equation 1 described above, and therefore, the arm width is made to be 0.1 mm.

However, if the arm width of the tuning-fork arms 121 and 122 is made to be 0.1 mm in this manner, there is a risk that the CI value becomes large.

Therefore, in this embodiment, to suppress an increase of the CI value, as shown in FIG. 1, the grooved portions 123 and 124 of the length 0.7 L are provided on the obverse surface and the rear surface of the tuning-fork arms 121 and 122 in the manner described above, so that, as shown in FIG. 3, the CI value becomes considerably low.

When the tuning-fork-type crystal vibrating piece 100 constructed as described above is placed within a package and a voltage is applied, the tuning-fork arms 121 and 122 vibrate. At this time, both the arm widths and the thicknesses of the tuning-fork arms 121 and 122 are formed to be 0.1 mm in the manner described above.

As a consequence, although the vibration of the vertical components is produced as shown in FIG. 14(b), the vibration is lessened in the cut section 126 of the base 110. Thus, the following can be prevented that energy escapes from the fixation area 111 of the base 110, vibration loss occurs, and the variations of the CI values between the vibrating piece devices are increased.

Furthermore, since the cut section 126 does not hinder the vibration of the tuning-fork arms 121 and 122 and is arranged at a position of the base 110 where no influence is exerted on the fixation of the fixation area 111 of the base 110, no adverse influence is exerted on the vibration of the tuning-fork arms 121 and 122 and on the fixation of the tuning-fork-type crystal vibrating piece 100 with respect to the package.

Furthermore, since the length of the base 110 can be shortened than the conventional vibrating piece, the size of the tuning-fork-type crystal vibrating piece 100 can be reduced, making it possible to reduce the size of a vibrator, etc., incorporating such a vibrating piece.

For the tuning-fork-type crystal vibrating piece 100 which is formed smaller, since the CI value of the fundamental wave is set to be very low as described above, and the CI value ratio is set to 1.0 or more, a very small vibrating reed having a higher precision is formed.

FIG. 7 shows a ceramic-packaged tuning-fork-type vibrator 200 which is a vibrator according to a second embodiment of the present invention.

This ceramic-packaged tuning-fork-type vibrator 200 uses the tuning-fork-type crystal vibrating piece 100 of the above-described first embodiment. Accordingly, the same reference numerals are used for the construction, the operation, etc., of the tuning-fork-type crystal vibrating piece 100, and description thereof is omitted.

FIG. 7 is a schematic sectional view showing the construction of the ceramic-packaged tuning-fork-type vibrator 200. As shown in FIG. 7, the ceramic-packaged tuning-fork-type vibrator 200 has a box-shaped package 210 having a space therein.

This package 210 comprises a base 211 on the bottom thereof. This base 211 is formed by, for example, ceramic such as alumina.

A sealing section 212 is provided on the base 211, with the sealing section 212 being formed from the same material as that of the base 211. Furthermore, a lid member 213 is placed in the upper end portion of this sealing section 212, and the base 211, the sealing section 212, and the lid member 213 form a hollow box.

An electrode 214 on the-package side is provided on the base 211 of the package 210 formed in this manner. A fixation area 111 of the base 110 of the tuning-fork-type crystal vibrating piece 100 is fixed onto the electrode 214 on the package side via a conductive bonding agent, etc.

Since this tuning-fork-type crystal vibrating piece 100 is formed as shown in FIG. 1, the CI value of the fundamental wave is minimized, and the CI value ratio is set to 1.0 or more. Additionally, it is small, and variations of the CI values between the vibrating piece devices are small. Therefore, the ceramic-packaged tuning-fork-type vibrator 200 incorporating this vibrating piece also becomes a small high-performance vibrator in which variations of the CI values between the vibrating piece devices are small.

FIG. 8 is a schematic view showing a portable digital phone 300 which is an electronic device according to a third embodiment of the present invention.

This portable digital phone 300 uses the ceramic-packaged tuning-fork-type vibrator 200 of the above-described second embodiment and the tuning-fork-type crystal vibrating piece 100.

Accordingly, the same reference numerals are used for the construction, the operation, etc., of the ceramic-packaged tuning-fork-type vibrator 200 and the tuning-fork-type crystal vibrating piece 100, and description thereof is omitted.

FIG. 8 shows the circuit blocks of the portable digital phone 300. As shown in FIG. 8, in a case where transmission is performed by the portable digital phone 300, when the user inputs his/her voice into a microphone, the signal passes through pulse-width modulation/coding blocks, modulator/demodulator blocks, a transmitter, and an antenna switch, and is transmitted from an antenna.

On the other hand, a signal transmitted from the telephone of another person is received by the antenna, passes through the antenna switch and the receiving filter, and is input to the modulator/demodulator blocks from the receiver. Then, the modulated or demodulated signal passes through the pulse-width modulation/coding blocks and is output from the speaker as sound.

A controller for controlling the antenna switch, the modulator/demodulator blocks, etc., among the above is provided.

There is a demand for this controller to have a high precision because it controls, in addition to the above, the LCD which is a display section, the keys which are a section for inputting numbers, the RAM, the ROM, etc. There is also a demand for the portable digital phone 300 to become smaller.

As a vibrator meeting such a demand, the above-described ceramic-packaged tuning-fork-type vibrator 200 is used.

Since this ceramic-packaged tuning-fork-type vibrator 200 has the tuning-fork-type crystal vibrating piece 100 shown in FIG. 1, the ceramic-packaged tuning-fork-type vibrating piece 200 has a low CI value, has a CI value ratio which is set to 1.0 or more, has small variations of the CI values between the vibrating piece devices, has a high precision, and becomes smaller. Therefore, the portable digital phone 300 incorporating this ceramic-packaged tuning-fork-type vibrator 200 becomes also a small high-performance portable digital phone in which variations of the CI values between the vibrating piece devices are small.

FIG. 9 shows a tuning-fork crystal oscillator 400 which is an oscillator according to a fourth embodiment of the present invention.

The construction of this digital tuning-fork crystal oscillator 400 is similar in many portions to the ceramic-packaged tuning-fork-type vibrator 200 of the above-described second embodiment. Accordingly, the same reference numerals are used for the construction, the operation, etc., of the ceramic-packaged tuning-fork-type vibrator 200 and the tuning-fork-type crystal vibrating piece 100, and description thereof is omitted.

The tuning-fork-type crystal oscillator 400 shown in FIG. 9 is formed in such a manner that an integrated circuit 410 is arranged below the tuning-fork-type crystal vibrating piece 100 of the ceramic-packaged tuning-fork-type vibrator 200 shown in FIG. 9 and on the base 211, as shown in FIG. 10.

More specifically, in the tuning-fork crystal oscillator 400, when the tuning-fork-type crystal vibrating piece 100 arranged therein vibrates, the vibration is input to the integrated circuit 410, and thereafter, as a result of extracting a predetermined frequency signal, the tuning-fork crystal oscillator 400 functions as an oscillator.

That is, since the tuning-fork-type crystal vibrating piece 100 housed in the tuning-fork crystal oscillator 400 is formed as shown in FIG. 1, the CI value is minimized, the CI value ratio is set to 1.0 or more, the size is reduced, and variations of the CI values between the vibrating piece devices are small. Therefore, the digital tuning-fork crystal oscillator 400 incorporating this vibrating piece becomes also a small high-performance oscillator in which variations of the CI values between the vibrating piece devices are small.

FIG. 10 shows a cylinder-type tuning-fork vibrator 500 which is a vibrator according to a fifth embodiment of the present invention.

This cylinder-type tuning-fork vibrator 500 uses the tuning-fork-type crystal vibrating piece 100 according to the first embodiment. Accordingly, the same reference numerals are used for the construction, the operation, etc., of the tuning-fork-type crystal vibrating piece 100, and description thereof is omitted.

FIG. 10 is a schematic view showing the construction of the cylinder-type tuning-fork vibrator 500.

As shown in FIG. 10, the cylinder-type tuning-fork vibrator 500 has a metal cap 530 for housing the tuning-fork-type crystal vibrating piece 100 therein. This cap 530 is press-fitted into a stem 520 so that the inside thereof is maintained in a vacuum state.

Furthermore, two leads 510 for holding the tuning-fork-type crystal vibrating piece 100 in nearly an H shape, housed in the cap 530 are arranged.

When an electric current is externally applied to such a cylinder-type tuning-fork vibrator 500, the tuning-fork arms 121 and 122 of the tuning-fork-type crystal vibrating piece 100 vibrate, and it functions as a vibrator.

At this time, since the tuning-fork-type crystal vibrating piece 100 is formed as shown in FIG. 1, the CI value is minimized, the CI value ratio is set to 1.0 or more, the size is reduced, and variations of the CI values between the vibrating piece devices are small. Therefore, the cylinder-type tuning-fork vibrator 500 incorporating this vibrating piece also becomes a small high-performance vibrator in which variations of the CI values between the vibrating piece devices are small.

Although in each of the above-described embodiments, a description is given by using a tuning-fork-type crystal vibrator of 32.738 kHz as an example, it is clear that a tuning-fork-type crystal vibrator of 15 to 155 kHz can also be used.

It is clear that the tuning-fork-type crystal vibrating piece 100 according to the above-described embodiments can be used for not only the above-described examples, but also for other electronic devices, mobile information terminals, built-in-clock devices such as televisions, video devices, radio cassette recorders, or personal computers, and clocks.

In addition, the present invention is not limited to the above-described embodiments, and various modifications are possible within the scope of the claims. A part of the construction of the above-described embodiments can be omitted, or can be changed to a desired combination which is not described in the foregoing.

The tuning-fork-type crystal vibrating piece 100 according to this embodiment is constructed as described above. The method of manufacturing the tuning-fork-type crystal vibrating piece 100 will be described below.

Initially, by etching a crystal substrate, a tuning-fork-type crystal vibrating piece in a state in which the electrode of FIG. 16 is not formed is formed. Thereafter, an electrode is formed in this tuning-fork-type crystal vibrating piece.

A step of forming an electrode will be described centering on tuning-fork arms 120 and 130. Since the tuning-fork arm 130 is the same as the tuning-fork arm 120, in the following, only the tuning-fork arm 120 will be described. FIG. 18 is a general flowchart showing electrode forming steps. FIG. 19 includes schematic views showing steps in which an electrode is formed in the tuning-fork arm 120.

First, FIG. 19($a$) is a schematic sectional view along the B–B' line in FIG. 16, of the tuning-fork arm 120 of the tuning-fork-type crystal vibrating piece in a state in which an outside shape is formed by the etching.

As shown in FIG. 19(a), grooved portions 120a and 130a are formed on the obverse surface 120e and the rear surface 120f of the tuning-fork arm 120 (grooved-portion forming step).

An electrode film 150, which is a metal film, is formed by sputtering, etc. on the entire vibrating piece, including the tuning-fork arm 120 (metal film forming step, ST1 in FIG. 18).

FIG. 19(b) shows this state. The electrode film 150 shown in FIG. 19 is formed in such a manner that a lower layer is made from Cr and the thickness is, for example, 100 Å to 1000 Å. Furthermore, an upper layer is made from Au and the thickness is, for example, 500 Å to 1000 Å.

After the electrode film 150 is formed on the entire surface in this manner, as shown in ST2 of FIG. 18, a photoresist is sprayed in a fine spray form so that it is coated on the entire surface of the electrode film 150. That is, as shown in FIG. 19(c), a photoresist film 151 is formed (photoresist layer forming step).

This photoresist is a compound based on a resin which is photosensitive to ultraviolet light and has fluidity. Therefore, the photoresist is coated by being sprayed in a fine spray form using, for example, a spray.

The thickness of the photoresist film 151 is, for example, 1 to 6 μm.

Next, as shown in ST3 in FIG. 18, a photoresist pattern is formed. More specifically, ultraviolet rays are radiated onto the photoresist film 151 via a mask (not shown) which covers a portion excluding the electrode formation portion (oblique lines) of FIG. 16 (exposure), it is removed using a developing solution, and after undergoing a heating step, etc., the photoresist film 151 is solidified.

As a result, a photoresist pattern 152 in a shape corresponding to the electrode formation portion (oblique lines) of FIG. 16 is formed.

At this time, in the photoresist pattern 152, a portion where the photoresist film 151 is not formed is formed at a spacing W1 for preventing a short-circuit in FIGS. 16 and 17, specifically, at a width of, for example, 15 μm.

The photoresist is coated onto the electrode film 150 in the manner described above. It is necessary to perform a coating so as to cover the edge portion (the arrow E in the figure) which is a corner portion of the tuning-fork arm 120 of FIG. 19(a). At this time, the edge portion E is covered efficiently when the photoresist to be coated is in a particulate form.

However, if the photoresist is coated in a state in which particulate matter is contained in this manner, the outside shape of the photoresist pattern 152 after the photoresist is developed is, to be accurate, not a nearly straight-line, but formed into a nearly wavy line along the outside shape of the particles.

If the line of the outside shape of the photoresist pattern 152 is nonuniform in this manner, in a case where a very small spacing such as the short-circuit prevention spacing W1 of 15 μm is to be formed, there is a risk that the spacing is not maintained partially.

Since the portion where the spacing is not maintained becomes a portion which is not etched, there is a risk that the electrodes are short-circuited with each other.

For this reason, in this embodiment, as shown in ST4 of FIG. 18, laser radiation is performed (pattern shape adjustment step). More specifically, this is performed on the short-circuit prevention spacing W1 of the obverse surface 120e of the arm of the tuning-fork arm 120 in FIG. 16, which is a shape of a part of the photoresist pattern 152.

More specifically, as shown in FIG. 20(a), the outside shape of the photoresist pattern 152 becomes nonuniform, and when etching is performed by using this photoresist pattern as a mask, in order that a groove electrode 120b and a side electrode 120d to be formed are not short-circuited with each other, the outside shape of the photoresist pattern 152 is adjusted by a laser so that the short-circuit prevention spacing W1 can be provided by, for example, 15 μm.

For this laser, for example, a YAG laser is used. In particular, if a third harmonic wave is used, the outside shape of the photoresist pattern 152 can be adjusted more accurately.

In this manner, since the laser is radiated after the photoresist pattern 152 is formed, it is not necessary to radiate a laser inside a yellow room where, particularly, the exposure of the photoresist is prevented, and thus the manufacturing cost can be reduced.

Furthermore, the radiation of the laser is separately performed on the short-circuit prevention spacing W1 of the obverse surface 120e of the arm of the tuning-fork arm 120 and on the short-circuit prevention spacing W1 of the rear surface 120f of the arm thereof, as shown in FIGS. 20(a) and 20(b).

However, in addition, as shown in FIG. 20(c), both the arm obverse surface 120e and the arm rear surface 120f can also be processed simultaneously using the laser.

In this case, since the number of production steps can be reduced, the production cost can also be reduced.

After the photoresist pattern 152 is accurately formed by the laser in this manner, the process proceeds to the etching step of ST5 of FIG. 18 (electrode film forming step).

More specifically, the electrode film 150 is removed by etching by using the photoresist pattern 152 as a mask.

FIG. 21(a) shows a state in which the electrode film 150 is removed by etching. As shown in FIG. 21(a), according to the manufacturing method of this embodiment, the short-circuit prevention spacing W1 can be accurately provided.

Next, if the photoresist pattern 152 is removed in the resist peeling-off step of ST6 of FIG. 18, as shown in FIG. 21(b), the groove electrode 120b and the side electrode 120d are accurately formed (photoresist pattern peeling-off step).

At this time, a part of the electrode film 150 is melted by laser radiation shown in FIG. 17 in the above-described laser radiation step (ST3), and a part of this melted electrode film 150 is removed together with the photoresist pattern 152. Therefore, the short-circuit prevention spacing W1 can be formed more accurately.

At this time, regarding the entire tuning-fork-type crystal vibrating piece 100, as shown in FIG. 16, a base electrode 140a, etc., is formed in a predetermined shape, and the electrode arrangement of the tuning-fork-type crystal vibrating piece 100 is terminated.

In the tuning-fork-type crystal vibrating piece 100 which is manufactured in this manner, the short-circuit prevention spacing W1 of the obverse surfaces 120e and 130e and the rear surfaces 120f and 130f of the arms of the tuning-fork arms 120 and 130 is accurately maintained at, for example, 15 μm, it is possible to effectively prevent the groove electrodes 120b and 130b from being short-circuited with the side electrodes 120d and 130d, and a tuning-fork-type crystal vibrating piece in which a failure is unlikely to occur is formed.

As has thus been described, according to the present invention, it is possible to provide a vibrating piece in which the CI value ratio is maintained constant while minimizing the CI value of the fundamental wave, variations of the CI values between the vibrating piece devices are reduced even if the base is made short, and the entire vibrating piece can be made smaller, a vibrator having the vibrating piece, an oscillator comprising the vibrator, and an electronic device comprising the vibrator.

What is claimed is:

1. A vibrator having a vibrating piece housed in a package, said vibrating piece comprising: a base; and a vibration arm section formed so as to protrude from this base, a grooved portion being formed in at least one of the obverse surface and the rear surface of said vibration arm section, wherein a cut section is formed in said base, and an electrode section is formed in a part of said grooved portion.

2. A vibrator according to claim 1, wherein a grooved portion is formed in at least one of the obverse surface and the rear surface of said vibration arm section, and an electrode section is formed in a part of said grooved portion so that the CI (crystal impedance) value ratio of said vibrating piece (CI value of the harmonic wave/CI value of the fundamental wave) becomes 1.0 or more.

3. A vibrator according to claim 2, wherein the length of the electrode section formed in a part of said grooved portion of said vibration arm section along the longitudinal direction is formed to be approximately 45% to approximately 55% with respect to the length of said vibration arm section.

4. A vibrator according to claim 1, wherein said electrode section is an excitation electrode.

5. A vibrator according to claim 1, wherein a fixation area for fixing the vibrating piece is provided in said base, and said cut section is provided in the base between the fixation area and said vibration arm section.

6. A vibrator according to claim 1, wherein said vibrating piece is a tuning-fork vibrating piece formed by a crystal which oscillates at approximately 30 kHz to approximately 40 kHz.

7. A vibrator according to claim 1, wherein said package is formed in a box shape.

8. A vibrator according to claim 1, wherein said package is formed in a commonly-called cylinder type.

* * * * *

UNITED STATES PATENT AND TRADEMARK OFFICE
CERTIFICATE OF CORRECTION

PATENT NO. : 6,927,530 B2
APPLICATION NO. : 10/771666
DATED : August 9, 2005
INVENTOR(S) : Hideo Tanaya, Fumitaka Kitamura and Junichiro Sakata It is certified that error appears in the above-identified patent and that said Letters Patent is hereby corrected as shown below:

Column 1, Line 45:   "13b" should be -- 13a --

Column 5, Line 64:   "an" should be -- a --

Column 10, Line 2:   "shortened" should be -- shorter --

Signed and Sealed this

Eighth Day of August, 2006

JON W. DUDAS
*Director of the United States Patent and Trademark Office*